United States Patent
Yao et al.

(10) Patent No.: US 12,274,361 B2
(45) Date of Patent: Apr. 15, 2025

(54) THREE-SECTION SLIDE RAIL DEVICE

(71) Applicant: FOSITEK CORPORATION, New Taipei (TW)

(72) Inventors: Hsu-Hong Yao, New Taipei (TW); Mo-Yu Zhang, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 183 days.

(21) Appl. No.: 18/333,158

(22) Filed: Jun. 12, 2023

(65) Prior Publication Data

US 2024/0324769 A1  Oct. 3, 2024

(30) Foreign Application Priority Data

Mar. 29, 2023  (TW) ................................. 112112009

(51) Int. Cl.
*A47B 88/49* (2017.01)
*A47B 88/427* (2017.01)
*A47B 88/473* (2017.01)
*F16C 29/02* (2006.01)
*H05K 7/14* (2006.01)

(52) U.S. Cl.
CPC ............ *A47B 88/49* (2017.01); *A47B 88/427* (2017.01); *A47B 88/473* (2017.01); *F16C 29/02* (2013.01); *F16C 2314/72* (2013.01); *H05K 7/1489* (2013.01)

(58) Field of Classification Search
CPC .... F16C 29/02; F16C 2314/72; A47B 88/427; A47B 88/473; A47B 88/49; A47B 2088/4272; A47B 2088/4274; A47B 2088/4276; A47B 2088/4278
See application file for complete search history.

(56) References Cited

U.S. PATENT DOCUMENTS

| | | | |
|---|---|---|---|
| 10,813,454 B1 * | 10/2020 | Chen | A47B 88/49 |
| 2018/0270982 A1 * | 9/2018 | Chen | A47B 88/423 |
| 2019/0082836 A1 * | 3/2019 | Chen | A47B 88/49 |
| 2022/0061528 A1 * | 3/2022 | Chen | A47B 88/49 |
| 2022/0240673 A1 * | 8/2022 | Chen | A47B 88/49 |

FOREIGN PATENT DOCUMENTS

GB  2490760 A * 11/2012 ............. A47B 88/49

* cited by examiner

*Primary Examiner* — Phillip A Johnson
(74) *Attorney, Agent, or Firm* — Birch, Stewart, Kolasch & Birch, LLP

(57) ABSTRACT

A three-section slide rail device includes an outer section, a middle section and an inner section. The middle section includes a middle rail and an inner middle block. The inner section includes an inner rail slidably disposed on the middle rail, and a removal operating assembly disposed on the inner rail. The removal operating assembly has a removal operating member, a removal connecting plate and a removal locking member pivotably mounted on the inner rail and having a removal guiding slot. The removal locking member has a locking portion and a protrusion. The removal operating member is operated to move the removal connecting plate and bring the protrusion to move along the removal guiding slot to result in pivoting of the removal locking member so as to disengage the locking portion from the inner middle block for permitting removal of the inner section from the middle section.

9 Claims, 25 Drawing Sheets

THREE-SECTION SLIDE RAIL DEVICE

CROSS-REFERENCE TO RELATED APPLICATION

This application claims priority to Taiwanese Patent Application No. 112112009, filed on Mar. 29, 2023.

FIELD

The disclosure relates to a slide rail device, and more particularly to a three-section slide rail device extendable in two extended states.

BACKGROUND

A conventional three-section slide rail device includes an outer section, a middle section and an inner section. Retaining mechanisms are disposed between any two of the outer section, the middle section and the inner section for preventing undesired removal thereof from each other. Each retaining mechanism generally has a leaf spring to provide a releasable locking, which results in elastic fatigue in a long term use and inconvenience during maintenance.

SUMMARY

Therefore, an object of the disclosure is to provide a three-section slide rail device that can alleviate at least one of the drawbacks of the prior art.

According to the disclosure, the three-section slide rail device includes an outer section, a middle section and an inner section. The middle section includes a middle rail which is disposed on and slidable along the outer section, and an inner middle block which is disposed on the middle rail. The inner section includes an inner rail which is disposed on and slidable along the middle rail, and a removal operating assembly which is disposed on the inner rail. The removal operating assembly has a removal operating member which is movably disposed on the inner rail, a removal connecting plate which is connected with the removal operating member, and a removal locking member which is pivotably mounted on the inner rail and which is connected with the removal connecting plate. The removal connecting plate has a removal guiding slot which has an inclined slot portion. The removal locking member has a locking portion which extends and is inclined downwardly to abut against the inner rail, and a protrusion which is inserted into and movable along the removal guiding slot. The locking portion is blocked by the inner middle block to prevent removal of the inner section from the middle section. The removal operating member is operated to move the removal connecting plate therewith and bring the protrusion to move along the removal guiding slot to result in pivoting of the removal locking member so as to disengage the locking portion from the inner middle block for permitting removal of the inner section from the middle section.

The locking portion is blocked by the inner middle block to prevent removal of the inner section from the middle section. When it is desired to remove the inner section from the middle section, the removal operating member is operated to move the removal connecting plate therewith and bring the protrusion to move along the removal guiding slot to result in pivoting of the removal locking member so as to disengage the locking portion from the inner middle block. The removal operation is convenient to conduct.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
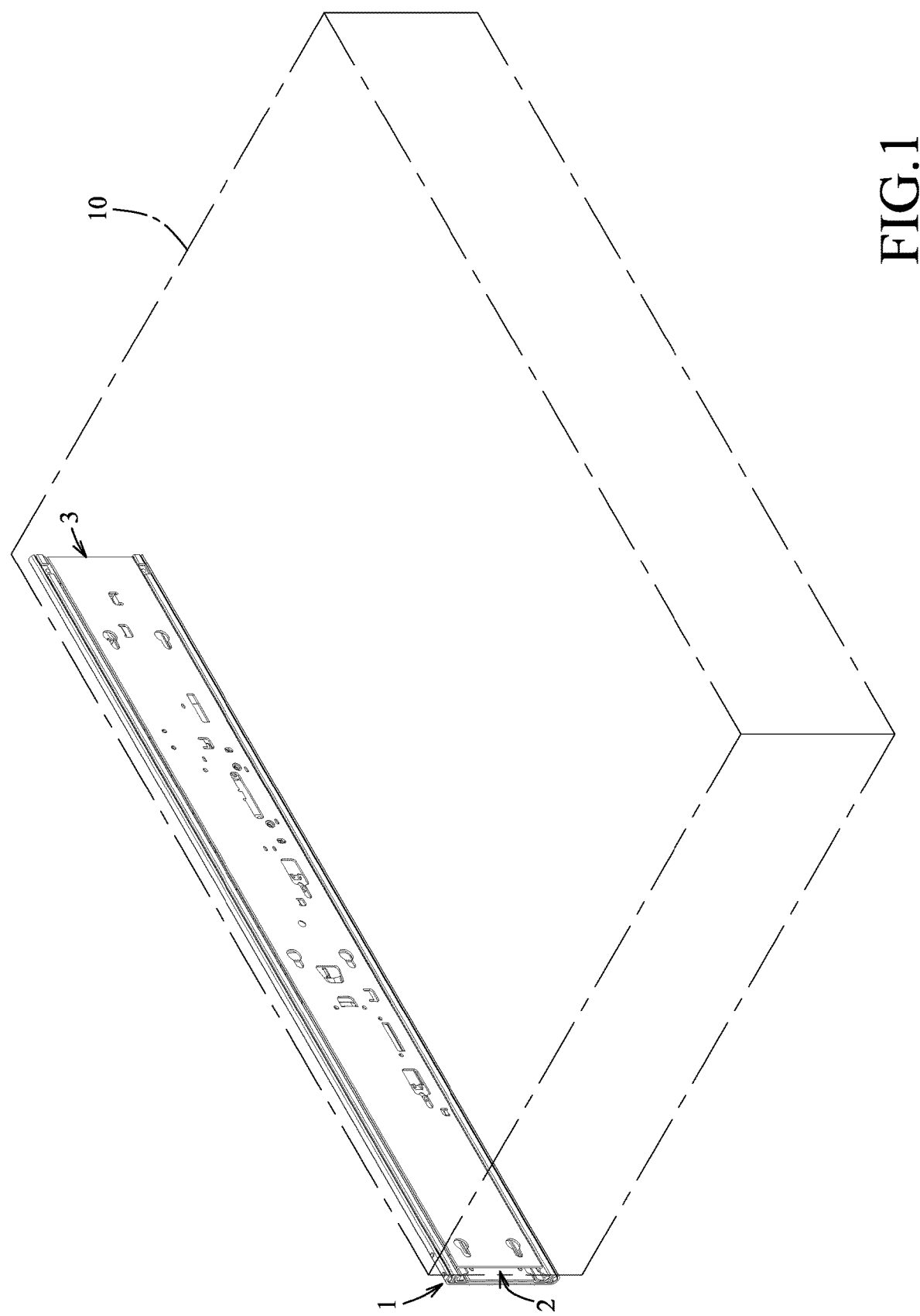
FIG. 1 is a perspective view illustrating an embodiment of a three-section slide rail device according to the disclosure.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
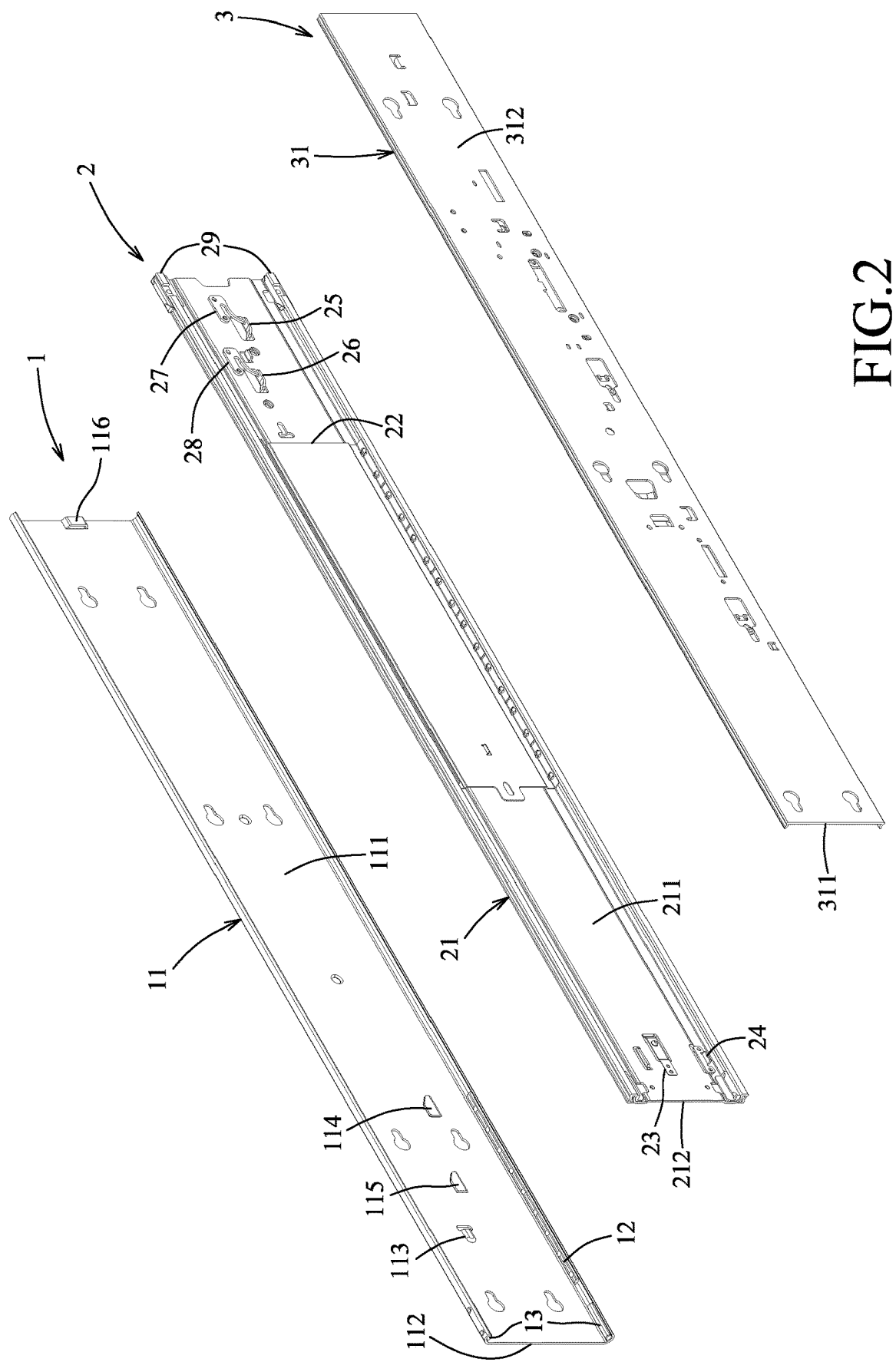
FIG. 2 is an exploded perspective view of the embodiment.

Referring to FIGS. 1 and 2, an embodiment of a three-section slide rail device according to the disclosure is adapted to be mounted on a server rack (not shown) for supporting a server case 10. Specifically, the server rack is provided with two slide rail devices at two lateral sides of the server case 10 (only one is shown in FIG. 1) for connecting and supporting the server case 10. Each slide rail device includes an outer section 1, a middle section 2 slidably disposed on the outer section 1, and an inner section 3 slidably disposed on the middle section 2. The outer section 1 is securely mounted on the serve rack. The inner section 3 is connected with a lateral side of the server case 10.

Figure 3:
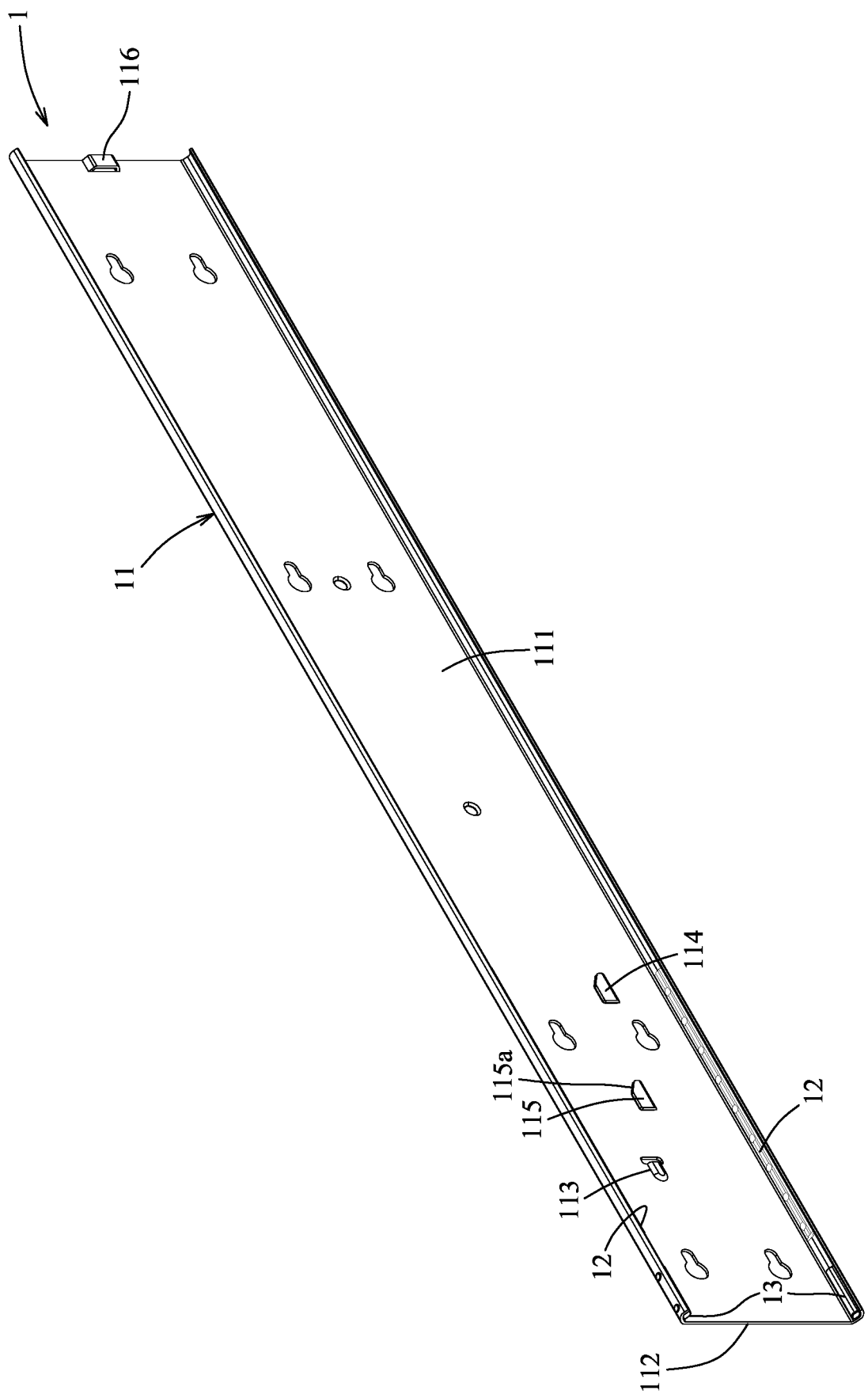
FIG. 3 is a perspective view of an outer section of the embodiment.

With reference to FIG. 3, the outer section 1 includes an outer rail 11, two ball chains 12 and two ball stop strips 13. The outer rail 11 has a sliding surface 111 for the middle section 2 to be slidably mounted, and a mounting surface 112 opposite to the sliding surface 111 that is securely mounted on the server rack. The ball chains 12 are disposed at upper and lower sides of the outer rail 11 for facilitating sliding of the middle section 2 relative to the outer rail 11. The ball stop strips 13 are respectively mounted on the upper and lower sides of the outer rail 11 to prevent removal of the ball chains 12 from the outer rail 11. An outer middle block 113, an anti-retraction block 114, a releasing block 115 and a terminal stop strip 116 are disposed on the sliding surface 111 and are spaced apart from one another. The releasing block 115 has an abutting slope surface (115a). The terminal stop strip 116 is disposed at an end of the outer rail 11 opposite to the ball strop strips 13 to prevent excess movement of the middle section 2 relative to the outer rail 11.

Figure 4:
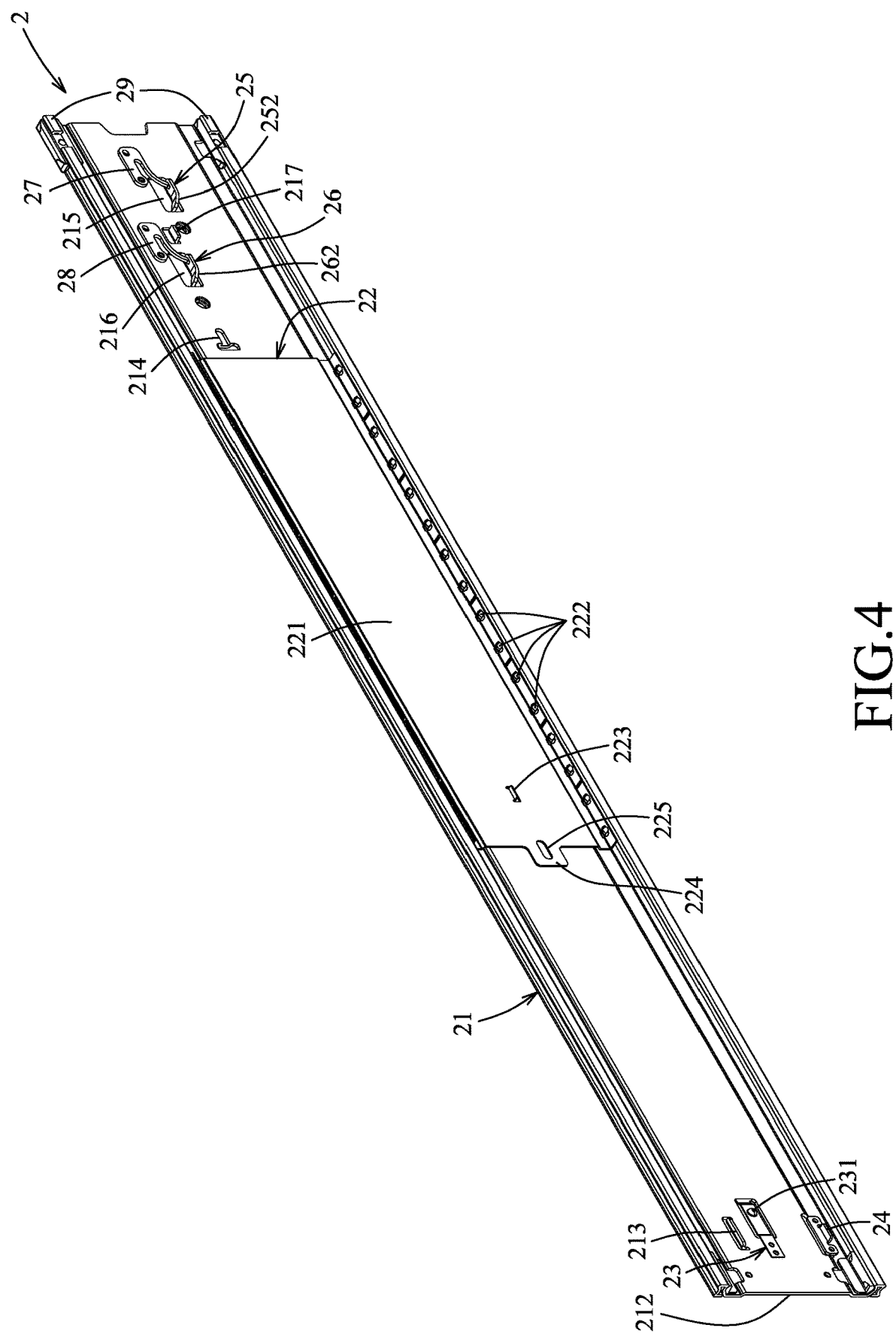
FIG. 4 is a perspective view of a middle section of the embodiment.
Figure 5:
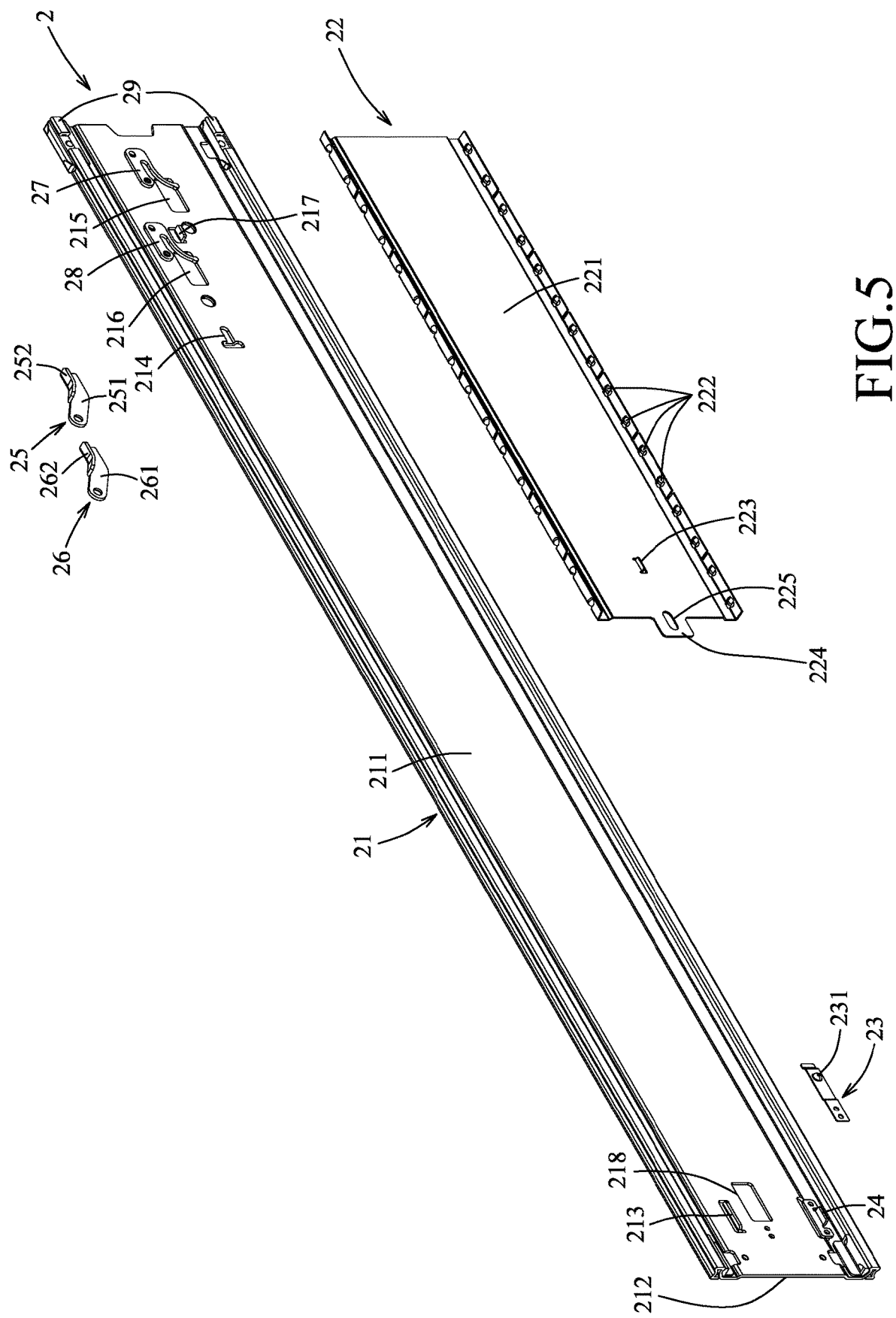
FIG. 5 is an exploded perspective view of the middle section.
Figure 6:
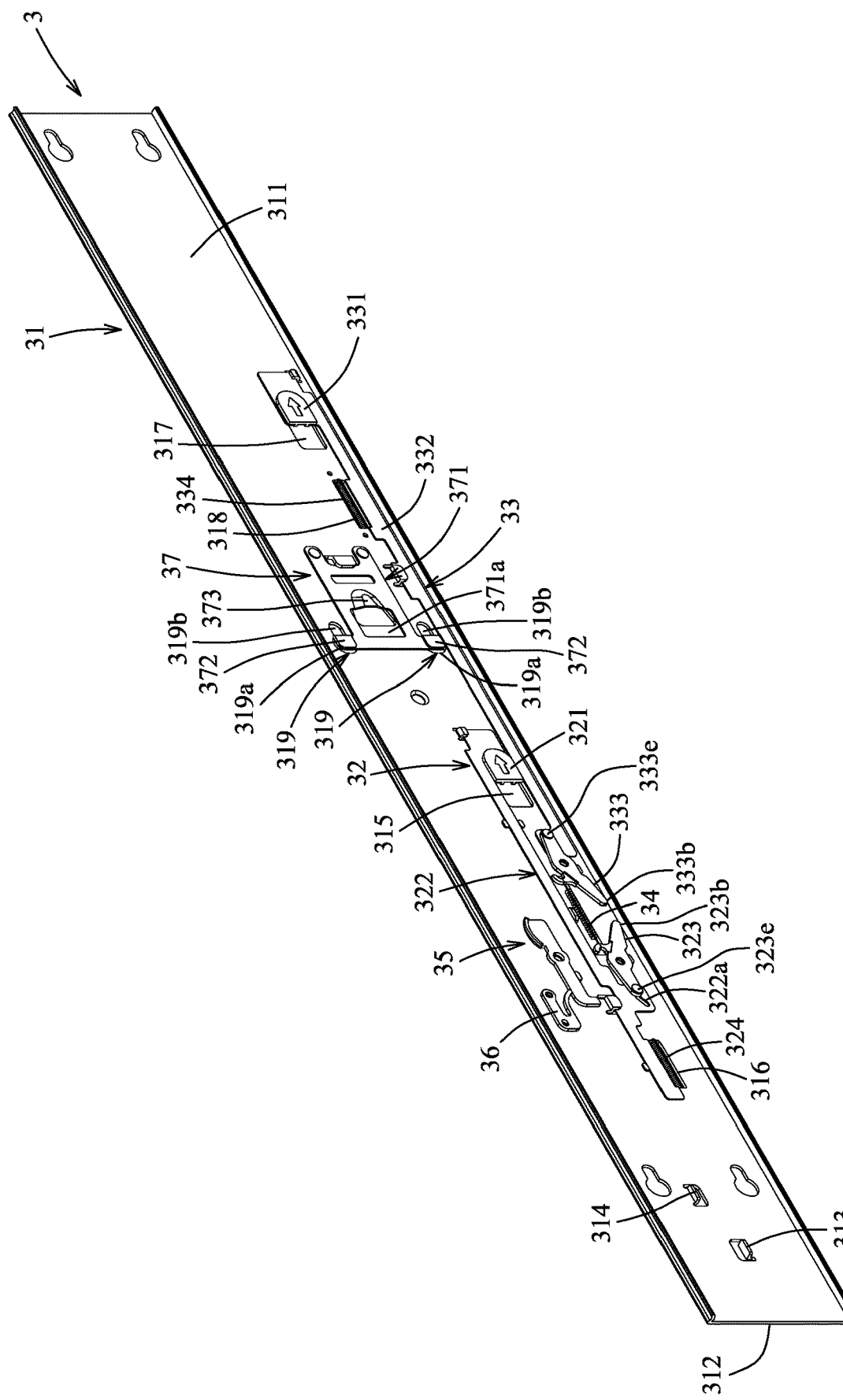
FIG. 6 is a perspective view of an inner section of the embodiment.
Figure 7:
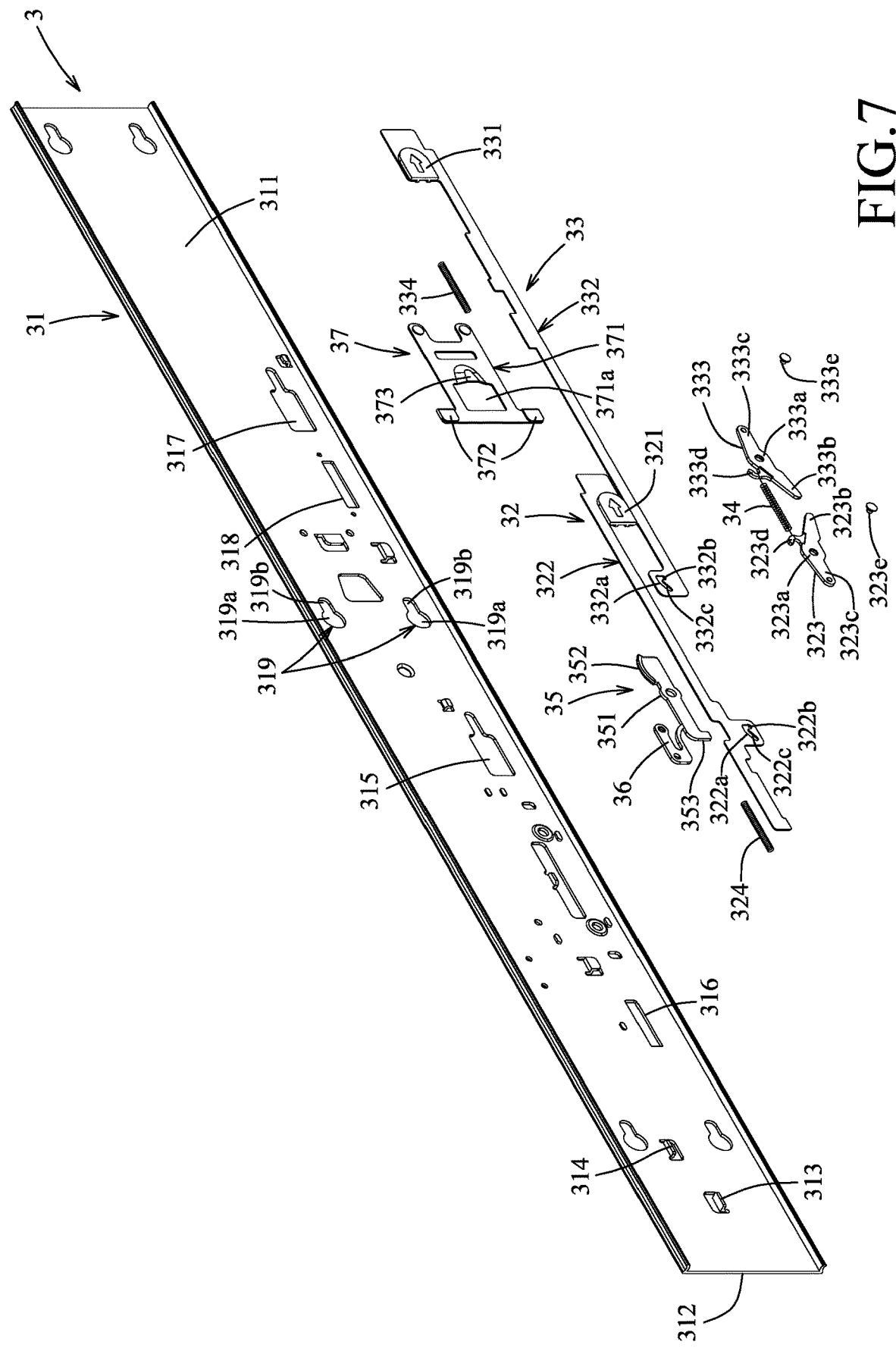
FIG. 7 is an exploded perspective view of the inner section.
Figure 8:
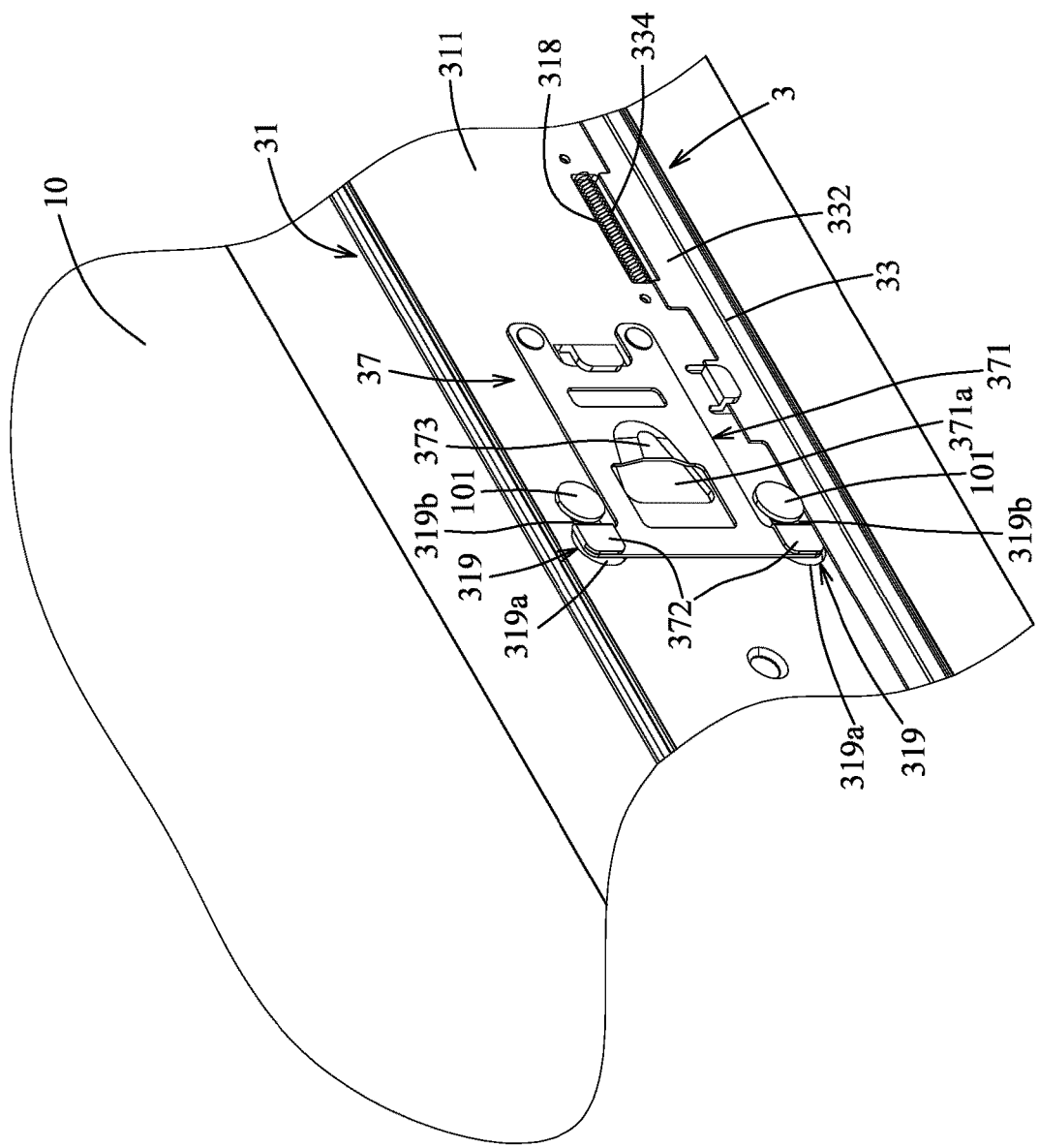
FIG. 8 is a fragmentary perspective view illustrating the inner section connected with two mounting studs of a server case.

With reference to FIGS. 2, 4 and 5, the middle section 2 includes a middle rail 21 which is disposed on and slidable along the outer rail 11, a ball sliding plate 22 which is slidably disposed on the middle rail 21, a leaf spring 23 which is disposed on one end of the middle rail 21, an inner middle block 24 which is disposed on the middle rail 21 below the leaf spring 23, an anti-retraction member 25 which is pivotably mounted on the other end of the middle rail 21, a driven member 26 which is pivotably mounted adjacent to the anti-retraction member 25, an anti-retraction biasing member 27 which is disposed on the middle rail 21 and which abuts against the anti-retraction member 25 to bias the anti-retraction member 25 downwardly, a driven biasing member 28 which is disposed on the middle rail 21 and which abuts against the driven member 26 to bias the driven member 26 downwardly, and two plate guarding members 29 which are disposed on upper and lower sides of the other end of the middle rail 21. The middle rail 21 has an inner surface 211 for the inner section 3 to be slidably mounted, an outer surface 212 opposite to the inner surface 211 to face the outer section 1, a synchronization releasing plate 213 which is formed on the inner surface 211 above the leaf spring 23, a retaining hole 214 which is engageable with the outer middle block 113 (see FIG. 13), a first mounting slot 215 which is formed adjacent to the retaining hole 214 for the anti-retraction member 25 to be mounted, a second mounting slot 216 for the driven member 26 to be mounted, a retraction stop block 217 which is formed on the inner surface 211 adjacent to the second mounting slot 216, and a third mounting slot 218 for the leaf spring 23 to be mounted. The ball sliding plate 22 has a plate body 221 which is disposed on and movable along the middle rail 21, a plurality of balls 222 which are disposed at upper and lower side edges of the plate body 221, a synchronizing block 223 which is formed on the plate body 221, a nose portion 224 which projects from an end of the plate body 221 toward the leaf spring 23 and which has a positioning hole 225. The leaf spring 23 is disposed at the third mounting slot 218 and has a protrusion 231. The anti-retraction member 25 has a pivoting portion 251 which is pivotably mounted to the outer surface 212 of the middle rail 21, and an anti-retraction portion 252 which is connected with the pivoting portion 251 and extends through the first mounting slot 215 to abut against and be biased by the anti-retraction biasing member 27. The anti-retraction member 25 is blocked by the anti-retraction block 114 (see FIG. 14) so as to prevent undesired retraction of the middle section 2 relative to the outer section 1. The driven member 26 has a pivoting portion 261 which is pivotably mounted to the outer surface 212 of the middle rail 21, and a driven portion 262 which is connected with the pivoting portion 261 and extends through the second mounting slot 216 to abut against and be biased by the driven biasing member 28. The plate guarding members 29 are disposed to prevent removal of the ball sliding plate 22 from the middle rail 21.

With reference to FIG. 2 and FIGS. 6, 7 and 8, the inner section 3 includes an inner rail 31 which is disposed on and slidable along the middle rail 21, a removal operating assembly 32 which is disposed on the inner rail 31, a retraction operating assembly 33 which is disposed on the inner rail 31, an operating biasing member 34 which is connected between the removal operating assembly 32 and the retraction operating assembly 33, a synchronizing actuating member 35 which is pivotably mounted to the inner rail 31, an actuating biasing member 36 which abuts against the synchronizing actuating member 35, and a case guarding member 37 which is disposed on the inner rail 31. The inner rail 31 has an inner surface 311 facing the middle rail 21, an outer surface 312 opposite to the inner surface 311, an abutment plate 313 formed on an end of the inner surface 311, a driving plate 314 formed on the inner surface 311 adjacent to the abutment plate 313, and first, second, third and fourth mounting holes 315, 316, 317, 318 and two fifth mounting holes 319 formed in the inner surface 311. Each fifth mounting hole 319 has an insert portion (319a) and a holding portion (319b) in communication with and dimensioned smaller than the insert portion (319a). Two mounting studs 101 of the server case 10 are inserted into the fifth mounting holes 319 (see FIG. 8). The case guarding member 37 has a plate body 371, two guarding portions 372 connected with the plate body 371 to be inserted into the insert portions (319a) to abut against the mounting studs 101, and a raised portion 373 formed on the plate body 371. The plate body 371 has an operating opening (371a). The raised portion 373 is formed adjacent to the operating opening (371a) and is raised toward the middle rail 21. The removal operating assembly 32 has a removal operating member 321 which is movably disposed in the first mounting hole 315, a removal connecting plate 322 which is connected with the removal operating member 321, a removal locking member 323 which is pivotably mounted on the inner surface 311 and which is connected with the removal connecting plate 322, and a return biasing member 324 which is disposed in the second mounting hole 316 and which is connected with the removal connecting plate 322. The removal connecting plate 322 has a removal guiding slot (322a) which is generally inverted-V shaped. The removal guiding slot (322a) has an upright slot portion (322b) which extends vertically, and an inclined slot portion (322c) which is communicated with and extends at an incline relative to the upright slot portion (322b). The removal locking member 323 has a fulcrum portion (323a) which is pivotably mounted on the inner surface 311, a locking portion (323b) which extends and is inclined downwardly from the fulcrum portion (323a) to abut against the inner rail 31, an actuated portion (323c) which extends from the fulcrum portion (323a) away from the locking portion (323b), and a hook portion (323d) which extends upwardly from the fulcrum portion (323a). A protrusion (323e) projects from the actuated portion (323c) and is inserted into and movable along the removal guiding slot (322a).

The retraction operating assembly 33 has a retraction operating member 331 which is movably disposed in the third mounting hole 317, a retraction connecting plate 332 which is connected with the retraction operating member 331, a retraction locking member 333 which is pivotably mounted on the inner surface 311 and which is connected with the retraction connecting plate 332, and a return biasing member 334 which is disposed in the fourth mounting hole 318 and which is connected with the retraction connecting plate 332. The retraction connecting plate 332 has a retraction guiding slot (332a) which is approximately in an inverted-V shaped. The retraction guiding slot (332a) has an upright slot portion (332b) which extends vertically, and an inclined slot portion (332c) which is communicated with and extends at an incline relative to the upright slot portion (332b). The retraction locking member 333 has a fulcrum portion (333a) which is pivotably mounted on the inner surface 311, a locking portion (333b) which extends and is inclined downwardly from the fulcrum portion (333a) to abut against the inner rail 31, an actuated portion (333c) which extends from the fulcrum portion (333a) away from the locking portion (333b), and a hook portion (333d) which extends upwardly from the fulcrum portion (333a). A protrusion (333e) projects from the actuated portion (333c) and is inserted into and movable along the retraction guiding slot (332a). The retraction locking member 333 and the removal locking member 323 are mirror images of each other. The operating biasing member 34 has two ends respectively connected with the hook portions (323d, 333d) to bias the removal locking member 333 and the retraction locking member 333 back to their original positions.

The synchronizing actuating member 35 has a fulcrum portion 351 which is pivotably mounted to the inner rail 31, and an abutting portion 352 and a hook portion 353 which are disposed at two sides of the fulcrum portion 351. The actuating biasing member 36 elastically abuts against the hook portion 353 to permit the hook portion 353 to firmly abut against the synchronizing block 223 of the ball sliding plate 22 so as to make movement of the ball sliding plate 22 synchronized with the inner section 3.

Figure 9:
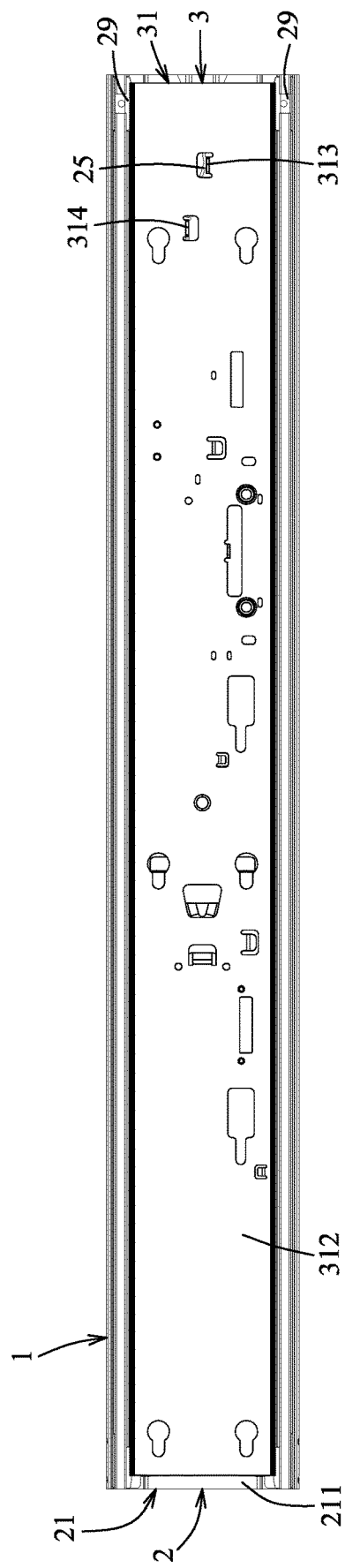
FIG. 9 is a side view illustrating the embodiment in a retracted state.
Figure 10:
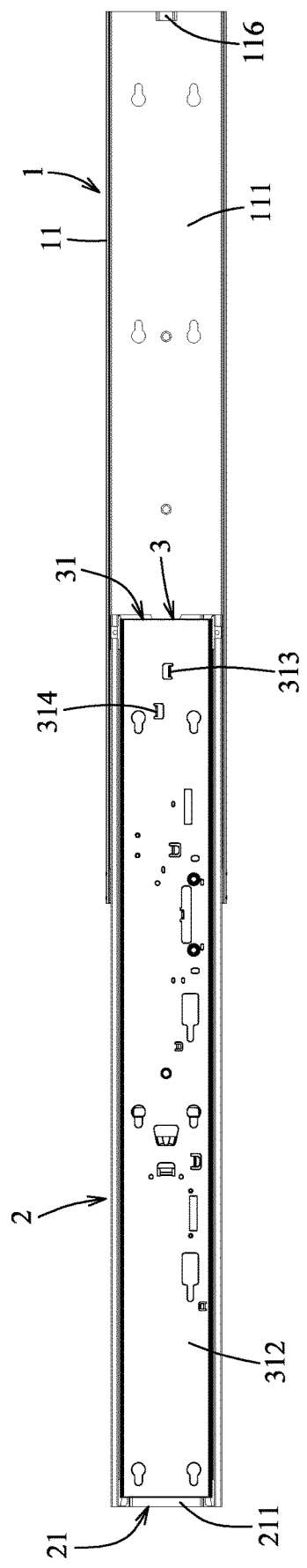
FIG. 10 is a side view illustrating the embodiment in a first extended state, where the middle section and the inner section are extended from the outer section.
Figure 15:
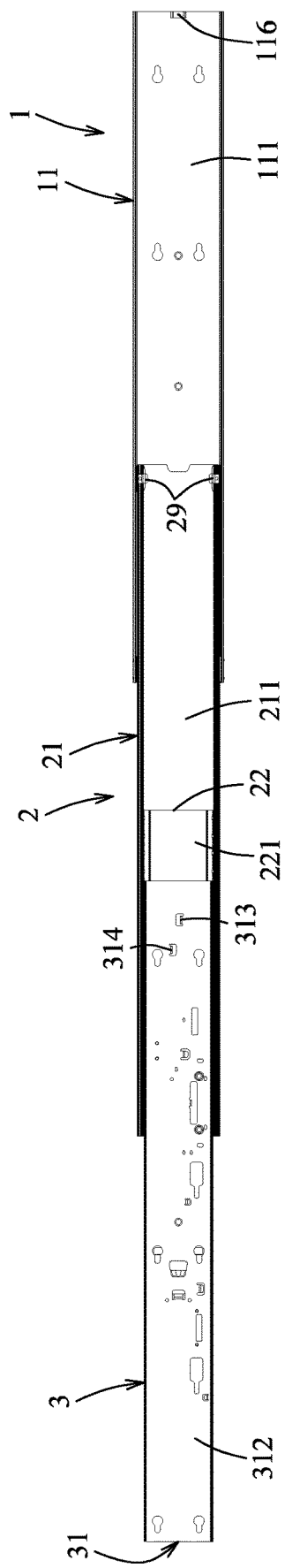
FIG. 15 is a side view illustrating the embodiment in a second extended state, where the middle section is extended from the outer section, and the inner section is extended from the middle section.

With reference to FIGS. 9, 10 and 15, the three-section slide rail device is shiftable among a retracted state, a first extended state and a second extended state. In the retracted state, the outer section 1, the middle section 2 and the inner section 3 are superimposed upon one another, as shown in FIG. 9. In the first extended state, the middle section 2 and the inner section 3 are extended from the outer section 1, as shown in FIG. 10. In the second extended state, the middle section 2 is extended from the outer section 1, and the inner section 3 is extended from the middle section 2, as shown in FIG. 15. The operation of the three-section slide rail device shifted from the retracted state to the first extended state and to the second extended state is described as follows.

Figure 11:
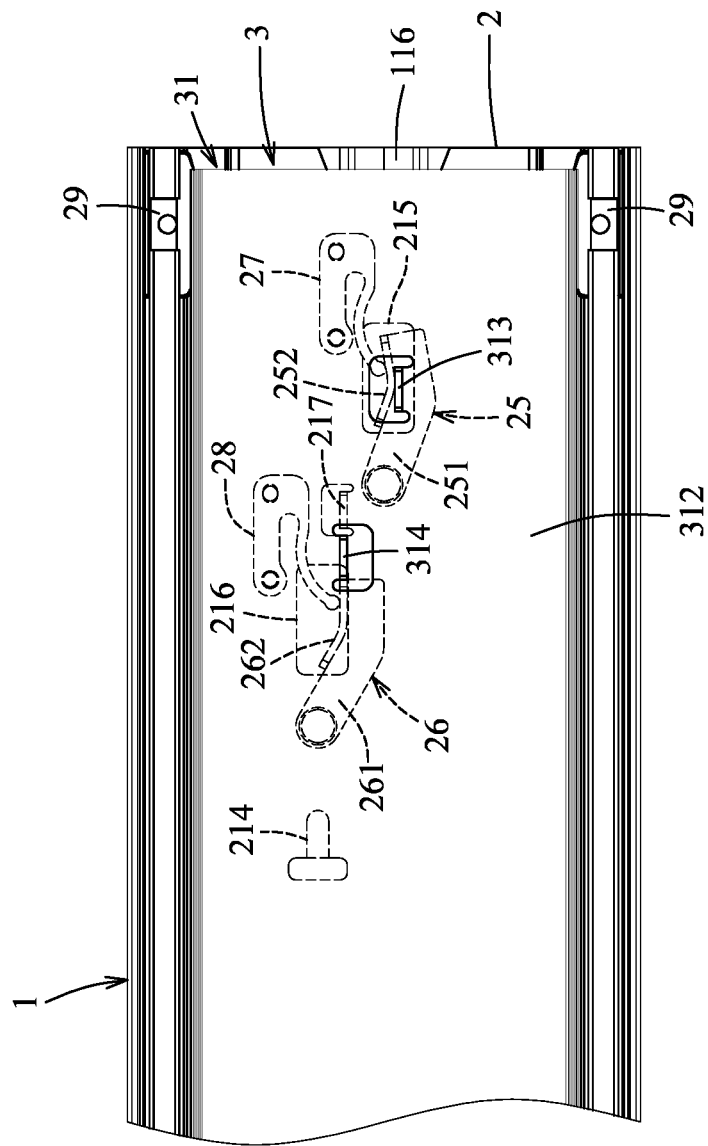
FIG. 11 is a fragmentary side view of the embodiment, illustrating an anti-retraction member and a driven member of the middle section engaged with an abutment plate and a driving plate of the inner section when the embodiment is in the retracted state.
Figure 12:
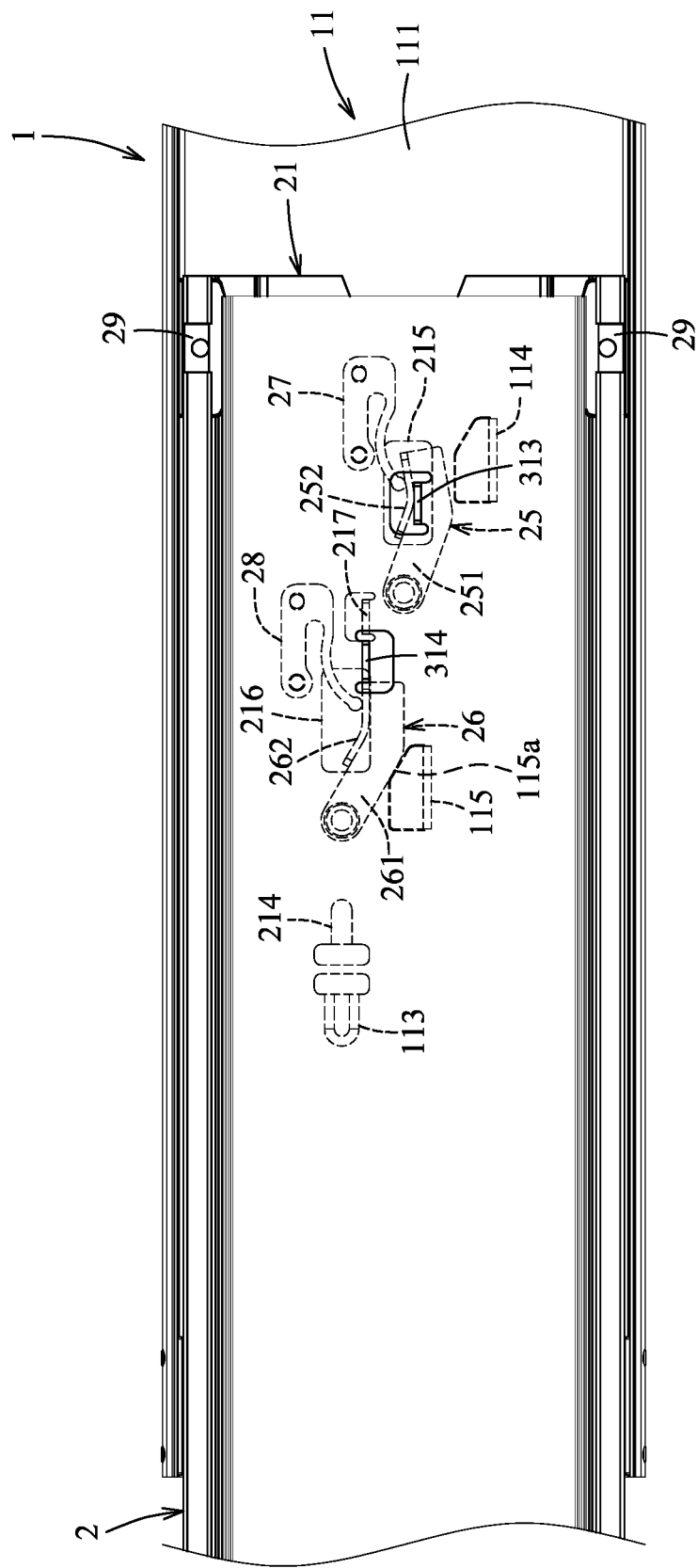
FIG. 12 is a fragmentary side view of the embodiment, illustrating the driven member of the middle section engaged with a releasing block of the outer section during the shifting of the embodiment from the retracted state toward the first extended state.
Figure 13:
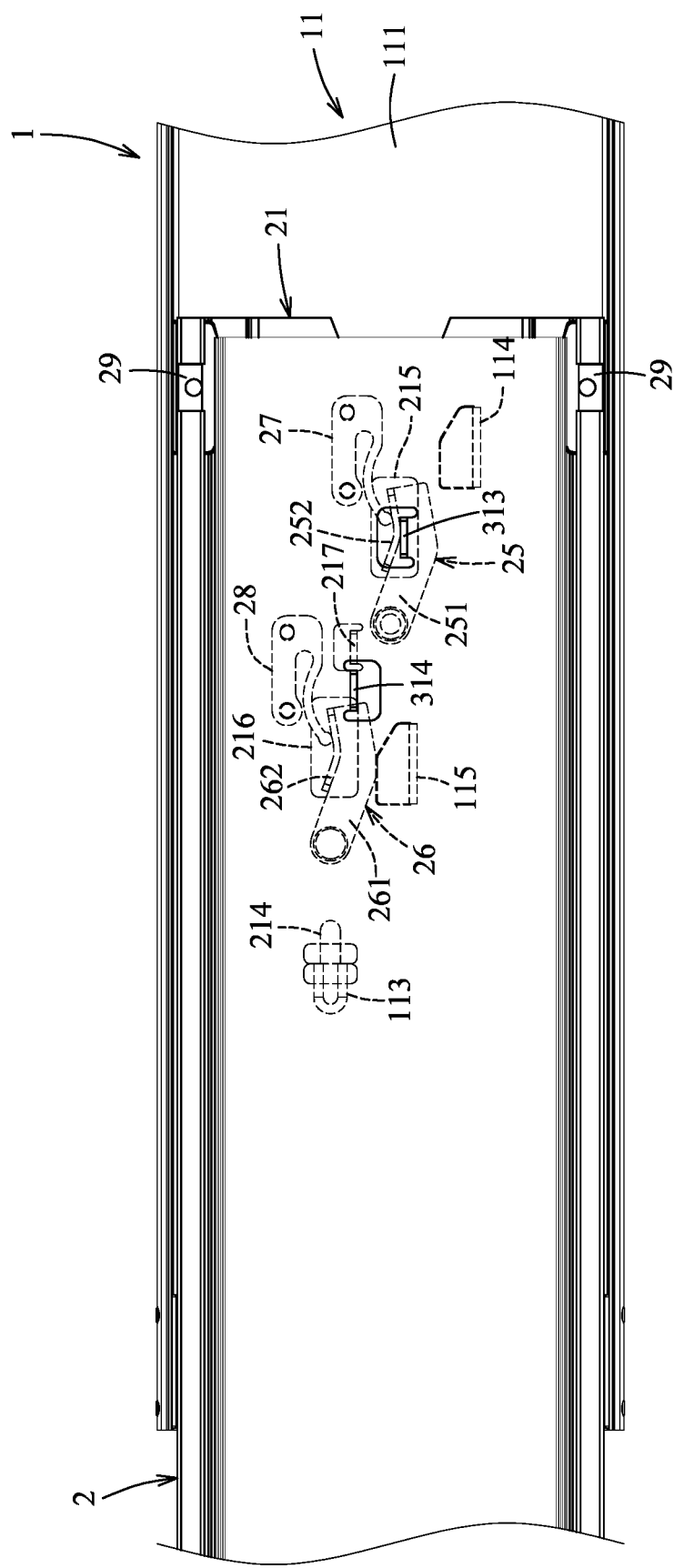
FIG. 13 is a fragmentary side view of the embodiment, illustrating the driven member disengaged from the driving plate when the embodiment is shifted to the first extended state.
Figure 14:
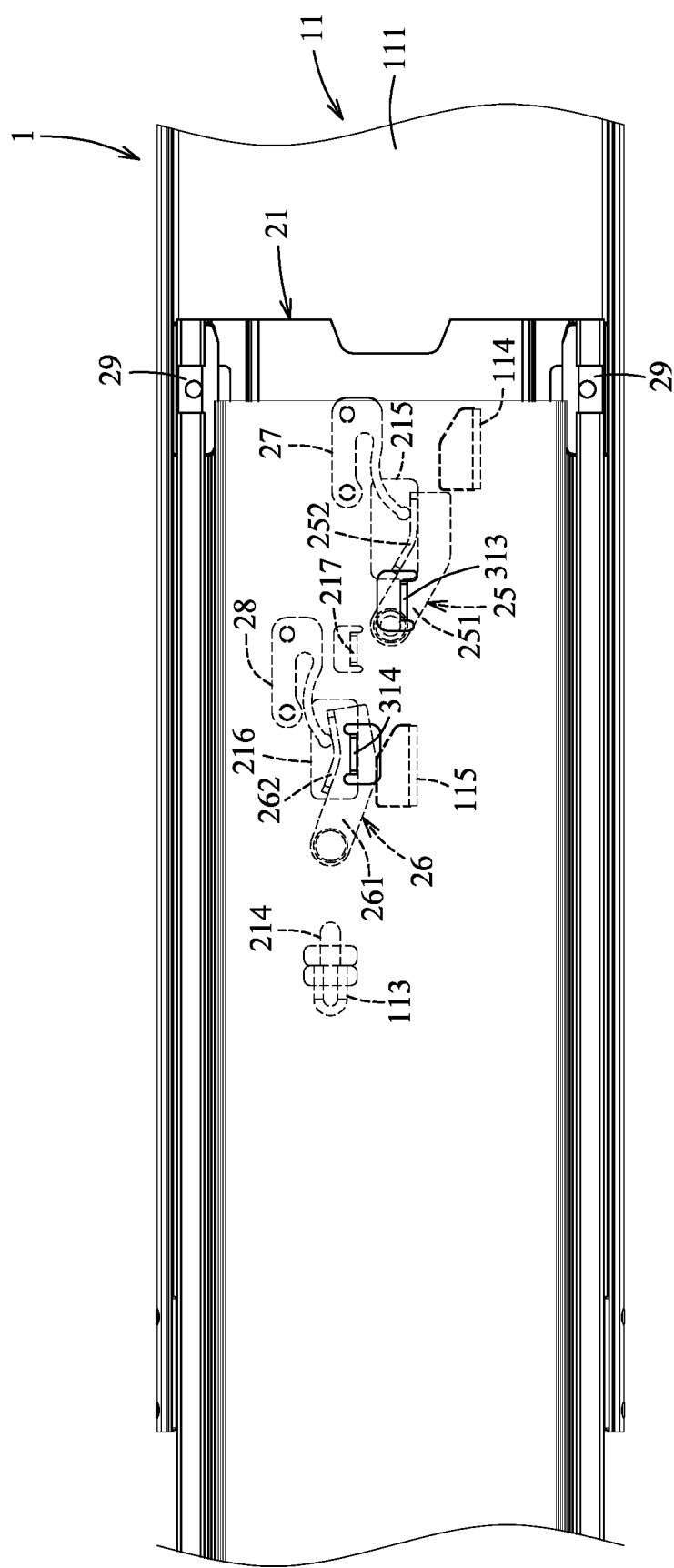
FIG. 14 is a fragmentary side view of the embodiment, illustrating the anti-retraction member disengaged from the abutment plate and turned downwardly and the middle section blocked by an anti-retraction block of the outer section when the inner section is moved leftwardly relative to the middle section.

Firstly, an operator pulls the server case 10 and the inner section 3 as well, and the middle section 2 is moved due to the driving plate 314 abutting against the driven member 26 to shift to the first extended state. With reference to FIGS. 11 and 12, during shifting to the first extended state, the driven member 26 is engaged with the abutting slope surface (115a) of the releasing block 115 of the outer section 1 and is abutted by the abutment plate 314, and the anti-retraction member 25 is abutted upwardly by the abutment plate 313 to be kept upwardly of the anti-retraction block 114. With reference to FIGS. 13, the leftward movement of the middle section 2 relative to the outer section 1 is stopped by the engagement of the outer middle block 113 with the retaining hole 214 so as to shift the slide rail device to the first extended state. At this stage, the driven member 26 is turned upwardly by the releasing block 115 so as to disengage from the driving plate 314 such that the inner section 3 is stopped from driving the synchronous movement of the middle section 2 and is movable leftwardly relative to the middle section 2 to be pulled out from the middle section 2. With reference to FIG. 14, when the inner section 3 is moved leftwardly relative to the middle section 2, the anti-retraction member 25 is disengaged from the abutment plate 313 to be turned downwardly by the anti-retraction biasing member 27 such that the middle section 2 is blocked by the anti-retraction block 114 to prevent rightward retraction thereof and be positioned relative to the outer section 1.

Figure 16:
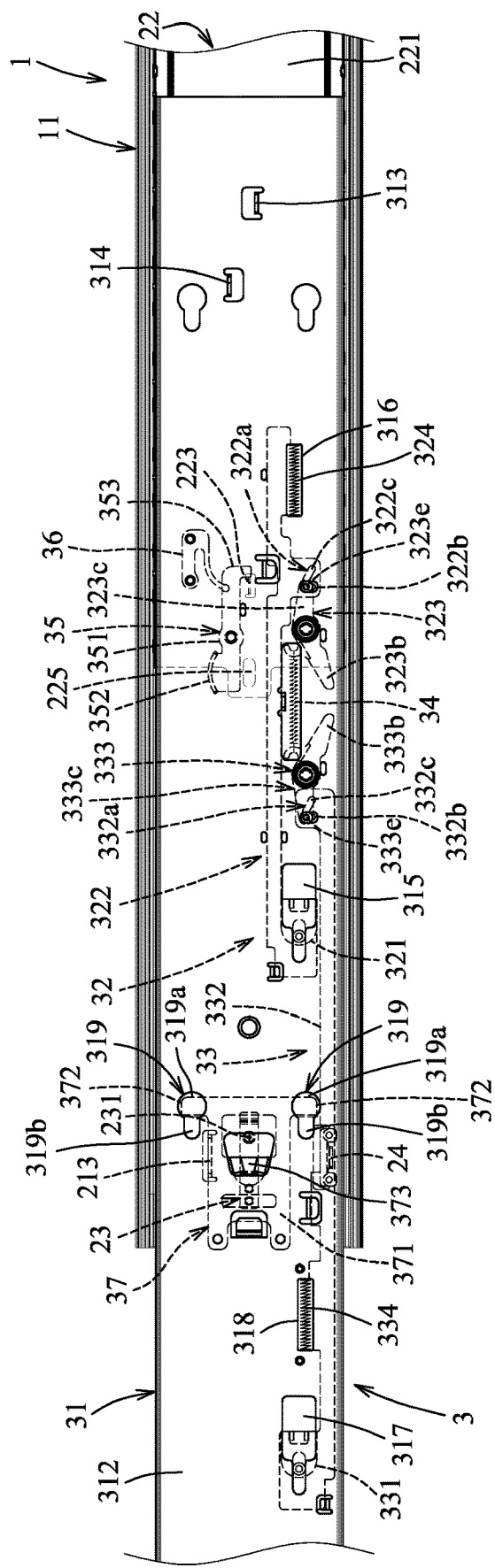
FIG. 16 is a fragmentary side view illustrating the embodiment during the shifting from the first extended state toward the second extended state.
Figure 17:
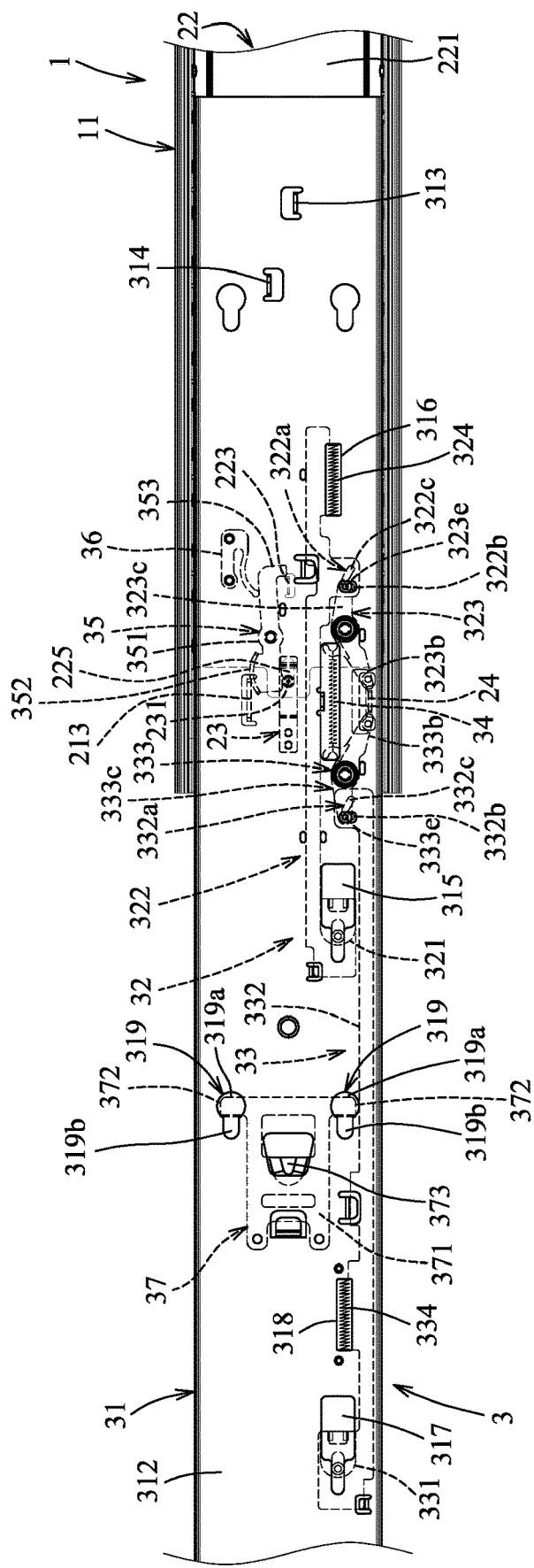
FIG. 17 is a fragmentary side view illustrating the embodiment in the second extended state.
Figure 18:
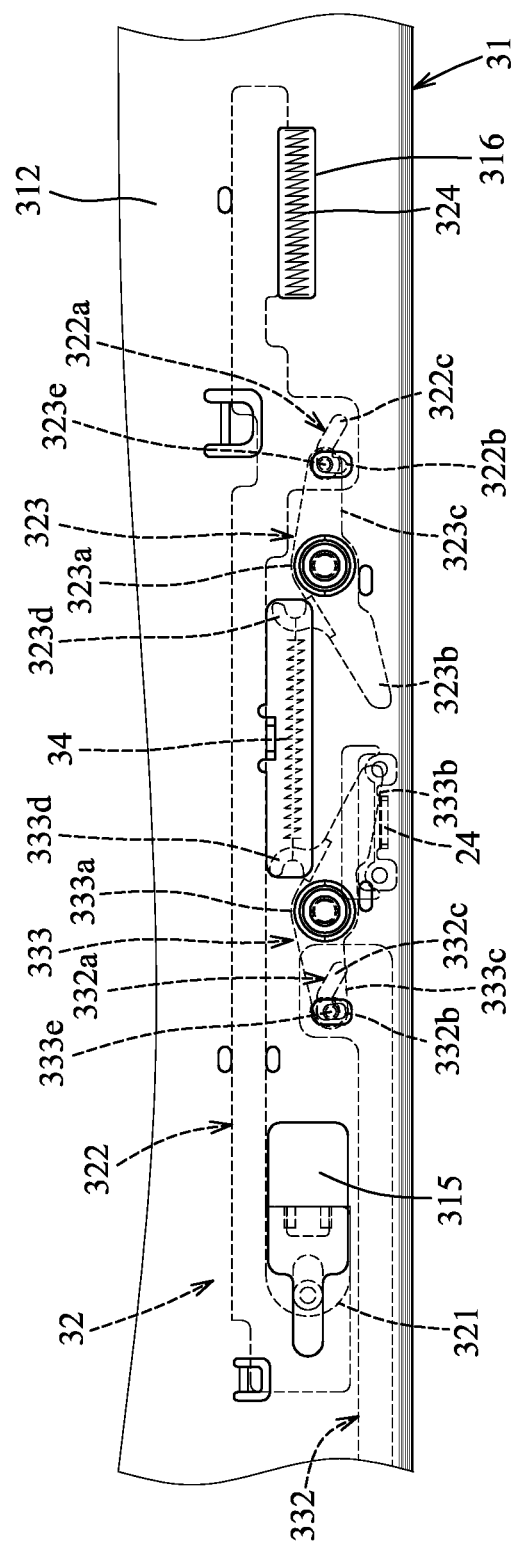
FIG. 18 is a fragmentary, enlarged side view illustrating an inner middle block of the middle section abutting against a retraction locking member of a retraction operating assembly of the inner section before the embodiment is shifted to the second extended state.
Figure 19:
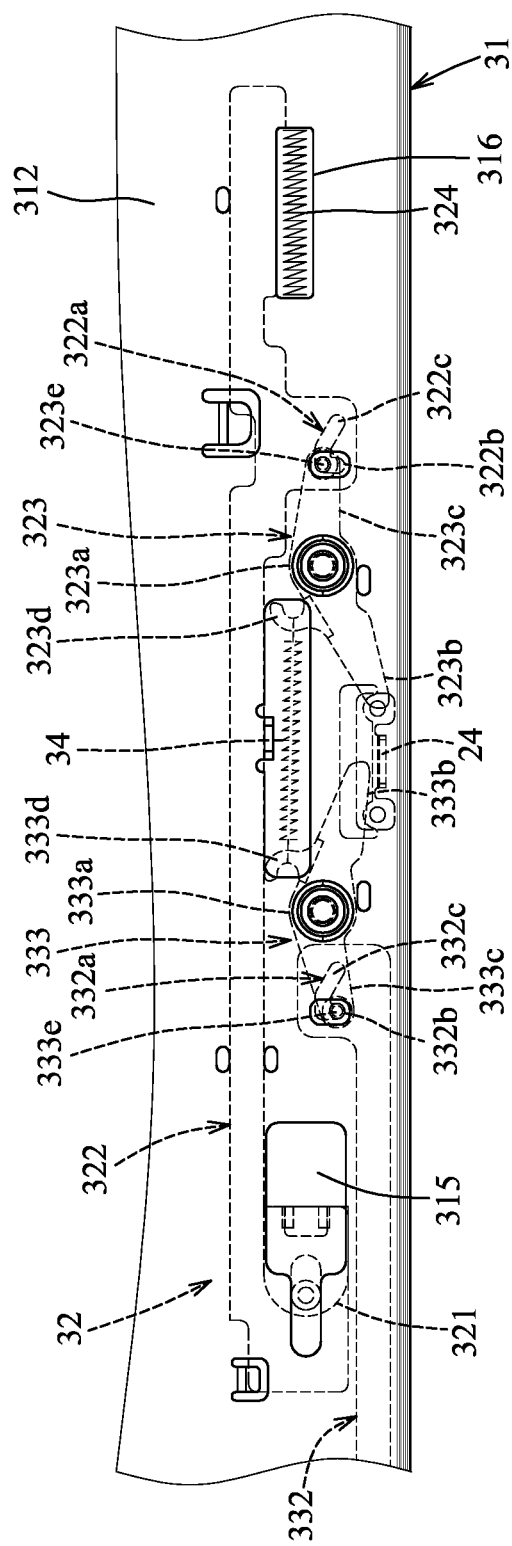
FIG. 19 is a fragmentary, enlarged side view illustrating the retraction locking member pivoted upwardly by the inner middle block before the embodiment is shifted to the second extended state.
Figure 20:
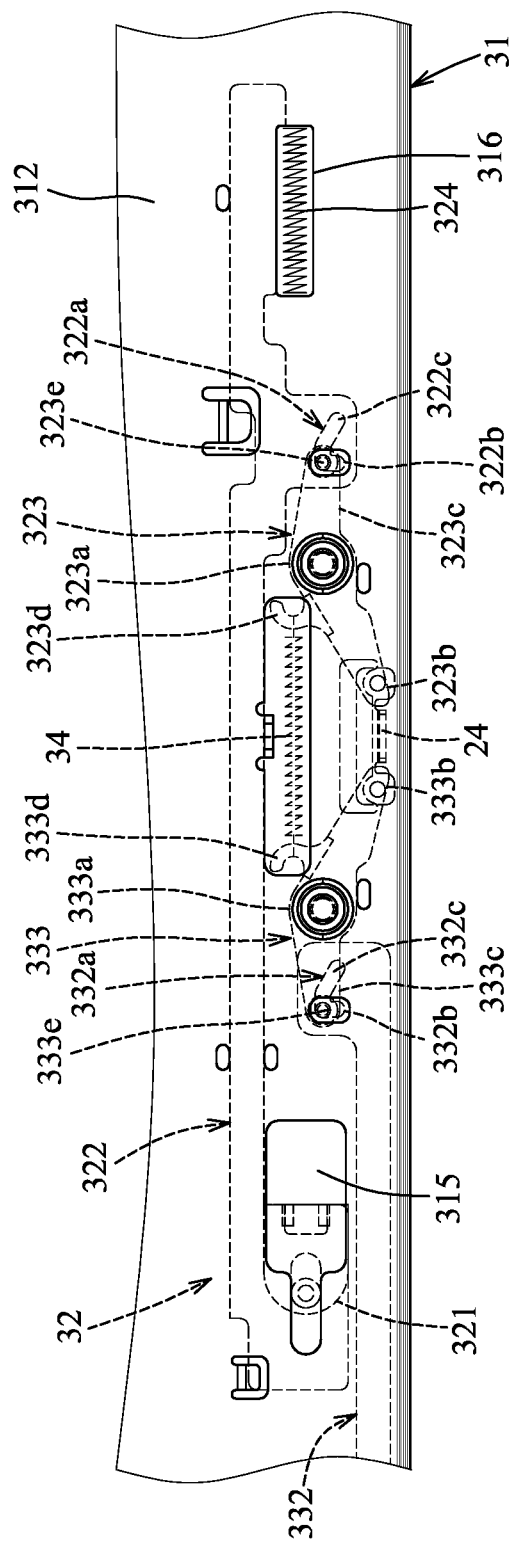
FIG. 20 is a fragmentary, enlarged side view illustrating the embodiment in the second extended state, where the inner middle block is interposed between the retraction locking member and a removal locking member of a removal operating assembly of the inner section.

Subsequently, with reference to FIGS. 16 and 17, during the leftward movement of the inner section 3 relative to the middle section 2, with the abutting engagement of the synchronizing actuating member 35 with the synchronizing block 223 of the ball sliding plate 22, the ball sliding plate 22 is moved leftwardly with the inner section 3 until the positioning hole 225 of the ball sliding plate 22 is engaged with the protrusion 231 of the leaf spring 23 to retain the ball sliding plate 22. During this movement, the abutting portion 352 of the synchronizing actuating member 35 is in abutting engagement with the synchronization releasing plate 213 to cause pivoting of the hook portion 353 so as to disengage the hook portion 353 from the synchronizing block 223. At this stage, the slide rail device is shifted to the second extended state, and the inner middle block 24 is interposed between the removal locking member 323 and the retraction locking member 333. Hence, the inner section 3 is retained relative to the middle section 2 to prevent further leftward movement thereof relative to the middle section 2 and removal thereof from the middle section 2. Also, the inner section 3 is prevented from making any rightward movement relative to the middle section 2 and retraction into the middle section 2. It is noted that, as shown in FIGS. 18 to 20, during the leftward movement of the inner section 3 toward the second extended state, the locking portion (333b) of the retraction locking member 333 is moved and abuts against the inner middle block 24, and, with the upright slot portion (332b) of the retraction guiding slot (332a) permitting the actuated portion (333c) to move, is turned upwardly by the inner middle block 24 until the inner middle block 24 is interposed between the retraction locking member 333 and the removal locking member 323. Next, with the operating biasing member 34, the retraction locking member 333 is turned back to its original position once the inner middle block 24 is interposed between the retraction locking member 333 and the removal locking member 323. At this time, the slide rail device is shifted to the second extended state.

Figure 21:
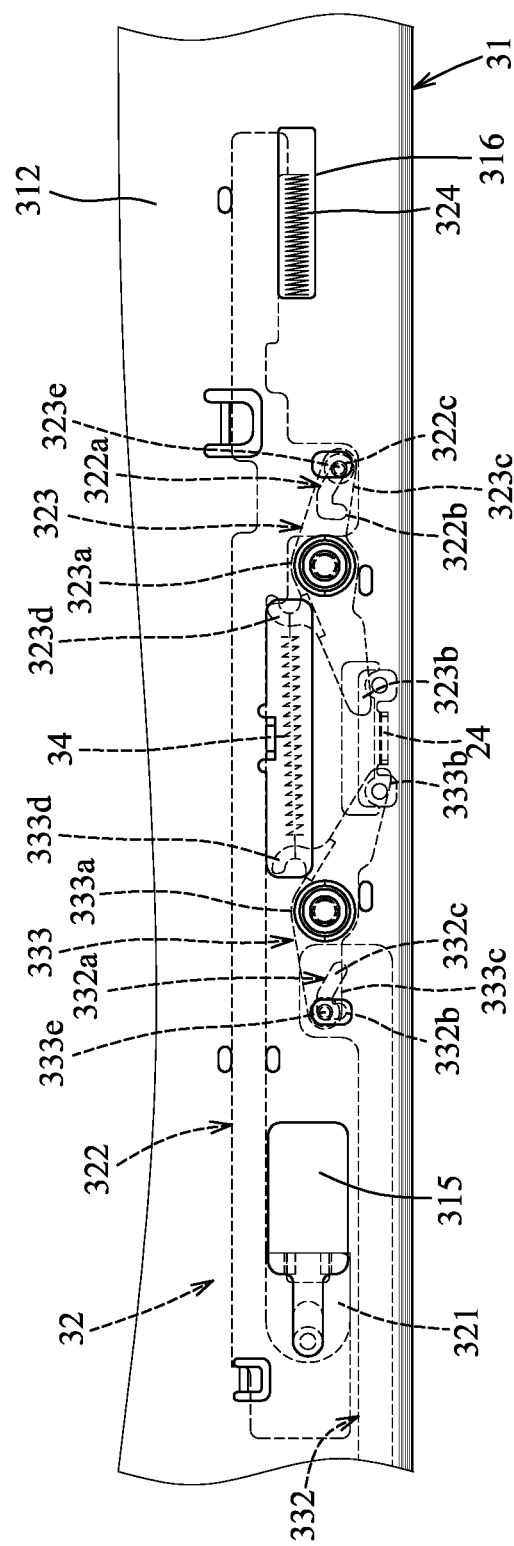
FIG. 21 is a fragmentary, enlarged side view illustrating a removal operating member of the removal operating assembly moved leftwardly and the removal locking member pivoted upwardly to be disengaged from the inner middle block.
Figure 22:
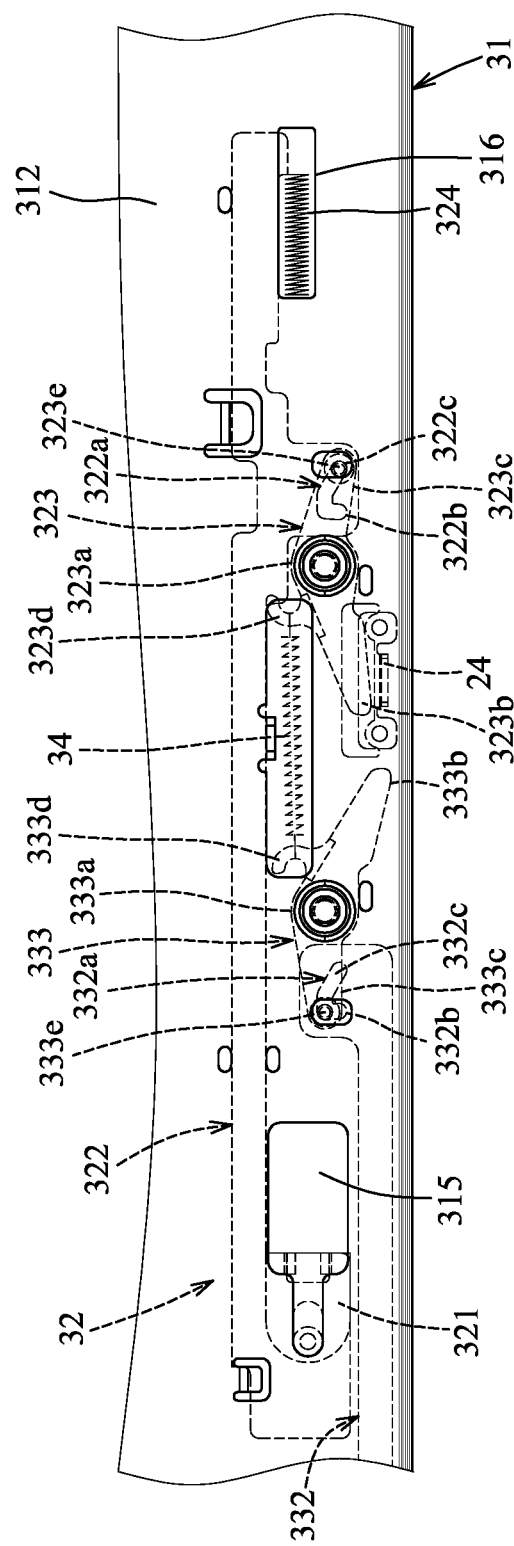
FIG. 22 is a fragmentary, enlarged side view illustrating the removal locking member released from the inner middle block to permit a leftward pulling movement of the inner section relative to the middle section.
Figure 23:
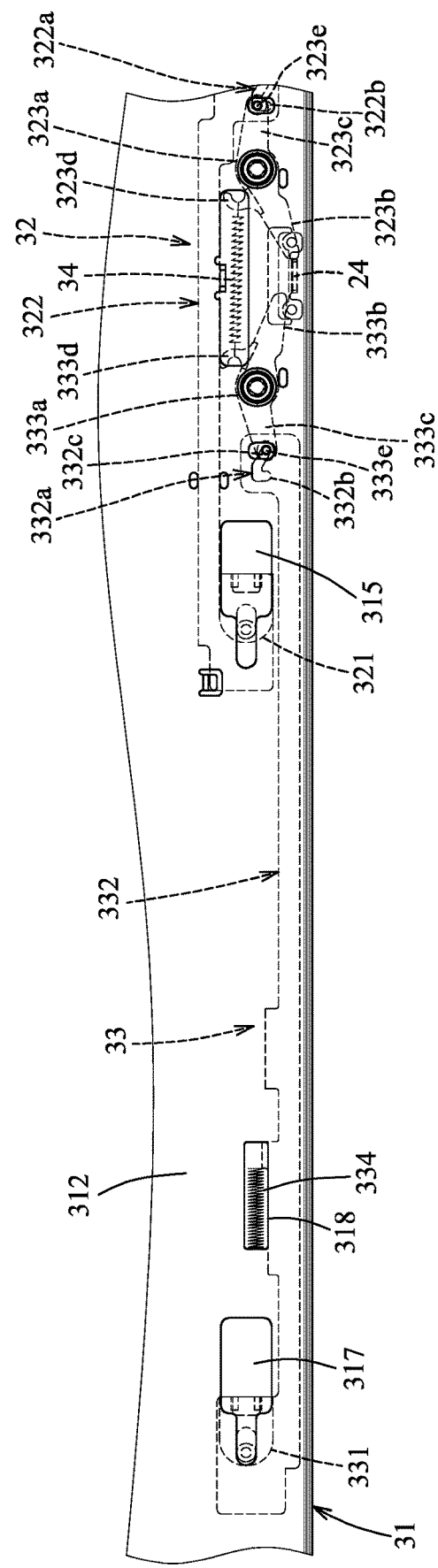
FIG. 23 is a fragmentary, enlarged side view illustrating a retraction operating member of the retraction operating assembly moved leftwardly and the retraction locking member pivoted upwardly to be disengaged from the inner middle block.
Figure 24:
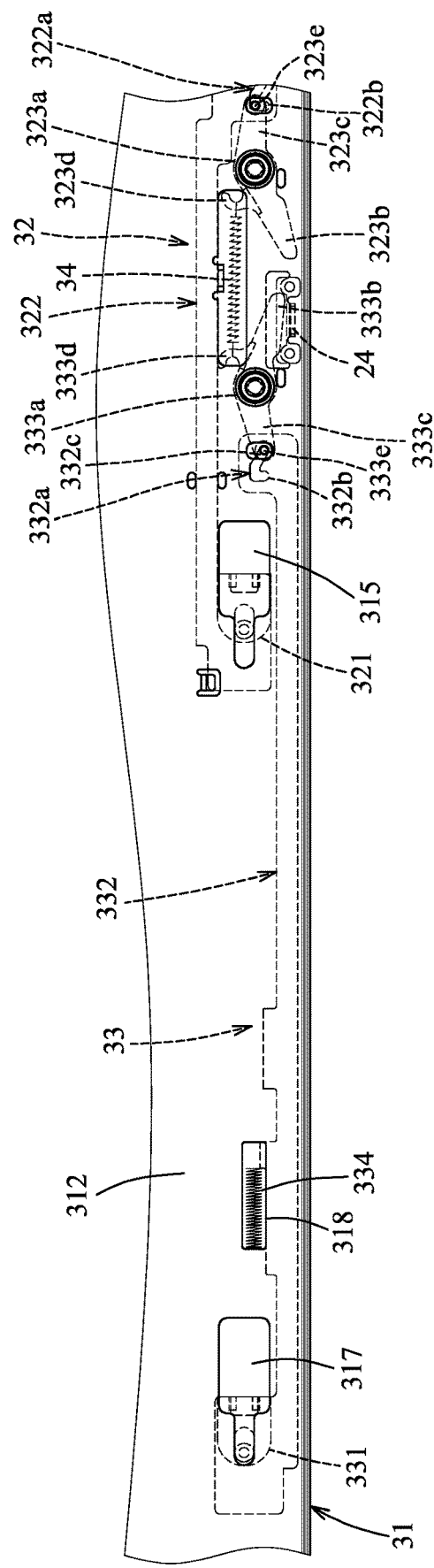
FIG. 24 is a fragmentary, enlarged side view illustrating the retraction locking member released from the inner middle block to permit a rightward retracting movement of the inner section relative to the middle section.
Figure 25:
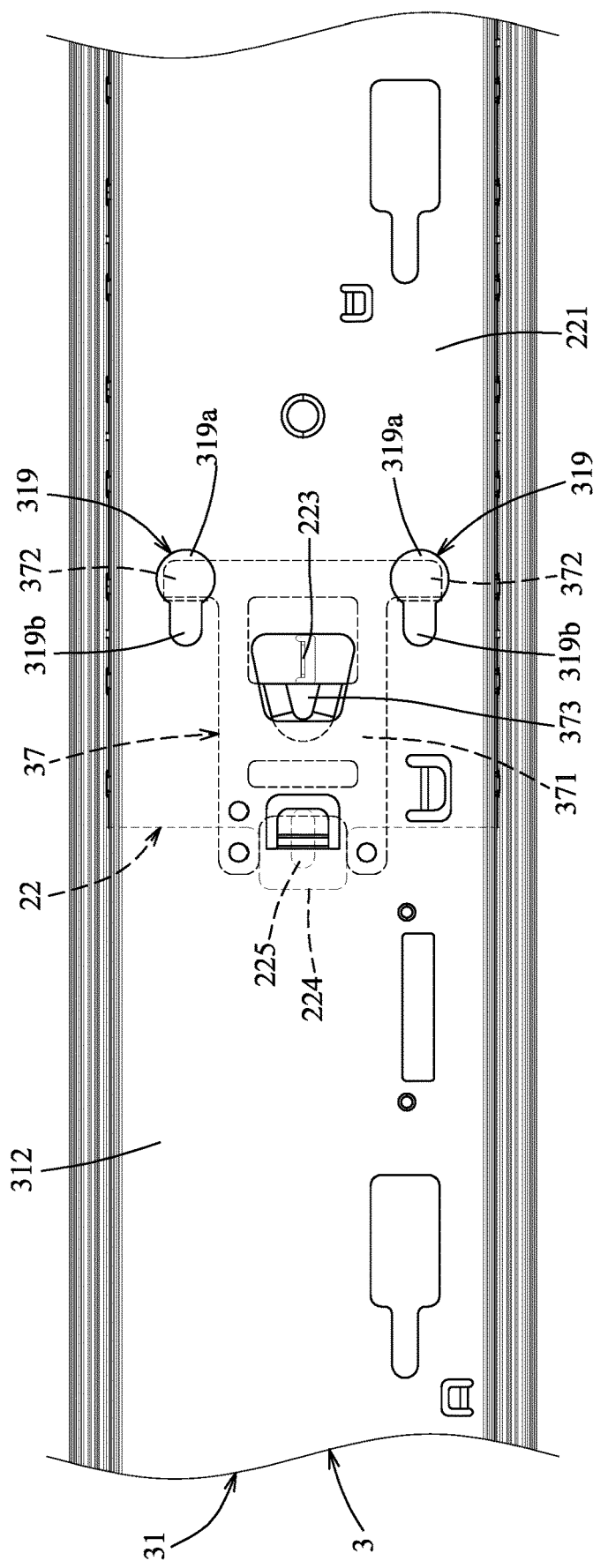
FIG. 25 is a fragmentary, enlarged side view illustrating a raised portion of a case guarding member of the inner section abutting against a synchronizing block of a ball sliding plate of the middle section.

Subsequently, with reference to FIGS. 21 and 22, when it is desired to remove the server case 10 (see FIG. 1) and the inner section 3 from the middle section 2 for conducting maintenance of the server case 10, the removal operating member 321 is pressed leftwardly to move the removal connecting plate 322 leftwardly. With the inclined slot portion (322c) of the removal guiding slot (322a), the protrusion (323e) of the removal locking member 323 is moved along the removal guiding slot (322a) to pivot the removal locking member 323 and turn the locking portion (323b) upward so as to disengage the locking portion (323b) from the inner middle block 24. At this stage, the inner section 3 is permitted to be moved leftwardly to separate from the middle section 2. The server case 10 and the inner section 3 can be placed back on the middle section 2 to shift the slide rail device to the second extended state, and the removal connecting plate 322 and the removal operating member 321 are biased to return back their original positions by means of the return biasing member 324. Subsequently, with reference to FIGS. 23 to 25, when it is desired to retract the inner section 3, the server case 10 and the inner section 3 are pressed rightwardly toward the middle section 2, and the retraction operating member 331 is pressed leftwardly to move the retraction connecting plate 332 leftwardly. With the inclined slot portion (332c) of the retraction guiding slot (332a), the protrusion (333e) of the retraction locking member 333 is moved along the retraction guiding slot (332a) to result in pivoting of the retraction locking member 333 and upward turning of the locking portion (333b) so as to disengage the locking portion (333b) from the inner middle block 24. At this stage, the inner section 3 is permitted to be moved rightwardly to retract into the middle section 2. During the retraction of the inner section 3, the raised portion 373 of the case guarding member 37 is in abutting engagement with the synchronizing block 223 of the ball sliding plate 22 to synchronously move the ball sliding plate 22 back to its original position where the positioning hole 225 of the ball sliding plate 22 is disengaged from the leaf spring 23 which prevents movement failure of the ball sliding plate 22 due to insufficient friction between the ball sliding plate 22 and the inner section 3. As such, the slide rail device is shifted to the first extended state. Subsequently, the middle section 2 and the inner section 3 are pressed rightwardly to shift back to the retracted state. With the return biasing member 334, the retraction operating member 331 and the retraction connecting plate 332 are biased to return back to their original positions.

As illustrated, the locking portion (323b) is blocked by the inner middle block 24 to prevent removal of the inner section 3 from the middle section 2. When it is desired to remove the inner section 3 from the middle section 2, the removal operating member 321 is operated to move the removal connecting plate 322 therewith and bring the protrusion (323e) to move along the removal guiding slot (322a) to result in pivoting of the removal locking member 323 so as to disengage the locking portion (323b) from the inner middle block 24. The removal operation is convenient to conduct.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A three-section slide rail device comprising:
an outer section;
a middle section including a middle rail which is disposed on and slidable along said outer section, and an inner middle block which is disposed on said middle rail; and
an inner section including an inner rail which is disposed on and slidable along said middle rail, and a removal operating assembly which is disposed on said inner rail, said removal operating assembly having a removal operating member which is movably disposed on said inner rail, a removal connecting plate which is connected with said removal operating member, and a removal locking member which is pivotably mounted on said inner rail and which is connected with said removal connecting plate, said removal connecting plate having a removal guiding slot which has an inclined slot portion, said removal locking member having a locking portion which extends and is inclined downwardly to abut against said inner rail, and a protrusion which is inserted into and movable along said removal guiding slot, said locking portion being blocked by said inner middle block to prevent removal of said inner section from said middle section, said removal operating member being operated to move said removal connecting plate therewith and bring said protrusion to move along said removal guiding slot to result in pivoting of said removal locking member so as to disengage said locking portion from said inner middle block for permitting removal of said inner section from said middle section.

2. The three-section slide rail device of claim 1, wherein said removal guiding slot further has an upright slot portion which extends vertically and which is communicated with said inclined slot portion.

3. The three-section slide rail device of claim 1, wherein said inner section further includes a retraction operating assembly, said retraction operating assembly having a retraction operating member which is movably disposed on said inner rail, a retraction connecting plate which is connected with said retraction operating member, and a retraction locking member which is pivotably mounted on said inner rail and which is connected with said retraction connecting plate, said retraction connecting plate having a retraction guiding slot which has an inclined slot portion, said retraction locking member having a locking portion which extends and is inclined downwardly to abut against said inner rail, and a protrusion which is inserted into and movable along said retraction guiding slot, said locking portion of said retraction locking member being blocked by said inner middle block to prevent retraction of said inner section toward said middle section, said retraction operating member being operated to move said retraction connecting plate therewith and bring said protrusion of said retraction locking member to move along said retraction guiding slot to result in pivoting of said retraction locking member so as to disengage said locking portion of said retraction locking member from said inner middle block for permitting retraction of said inner section toward said middle section.

4. The three-section slide rail device of claim 3, wherein said retraction guiding slot further has an upright slot portion which extends vertically and which is communicated with said inclined slot portion of said retraction guiding slot.

5. The three-section slide rail device of claim 3, wherein said removal locking member has a fulcrum portion which is pivotably mounted on said inner rail, and an actuated portion which extends from said fulcrum portion away from said locking portion and from which said protrusion projects.

6. The three-section slide rail device of claim 5, wherein said retraction locking member has a fulcrum portion which is pivotably mounted on said inner rail, and an actuated portion which extends from said fulcrum portion away from said locking portion and from which said protrusion projects.

7. The three-section slide rail device of claim 6, wherein said removal locking member has a hook portion which extends upwardly from said fulcrum portion, said retraction locking member having a hook portion which extends upwardly from said fulcrum portion of said retraction locking member, said inner section further including an operating biasing member which has two ends respectively connected with said hook portions.

8. The three-section slide rail device of claim 3, wherein said removal operating assembly further has a returning biasing member which is connected between said inner rail and said removal connecting plate to bias said removal operating member and said removal connecting plate back to their original positions.

9. The three-section slide rail device of claim 3, wherein said retraction operating assembly further has a return biasing member which is connected between said inner rail and said retraction connecting plate to bias said retraction operating member and said retraction connecting plate back to their original positions.

\* \* \* \* \*